(12) United States Patent
Tomino et al.

(10) Patent No.: US 9,018,622 B2
(45) Date of Patent: Apr. 28, 2015

(54) METHOD FOR MANUFACTURING ORGANIC SEMICONDUCTOR ELEMENT

(75) Inventors: Ken Tomino, Tokyo-to (JP); Shin-ya Fujimoto, Tokyo-to (JP); Hiroki Maeda, Tokyo-to (JP)

(73) Assignee: Dai Nippon Printing Co., Ltd., Tokyo-to (JP)

( * ) Notice: Subject to any disclaimer, the term of this patent is extended or adjusted under 35 U.S.C. 154(b) by 63 days.

(21) Appl. No.: 14/110,648

(22) PCT Filed: Apr. 11, 2012

(86) PCT No.: PCT/JP2012/059929
§ 371 (c)(1),
(2), (4) Date: Oct. 8, 2013

(87) PCT Pub. No.: WO2012/141225
PCT Pub. Date: Oct. 18, 2012

(65) Prior Publication Data
US 2014/0042421 A1   Feb. 13, 2014

(30) Foreign Application Priority Data
Apr. 11, 2011   (JP) .................. 2011-087686

(51) Int. Cl.
*H01L 51/05*   (2006.01)
*H01L 51/00*   (2006.01)

(52) U.S. Cl.
CPC ........ *H01L 51/0512* (2013.01); *H01L 51/0012* (2013.01); *H01L 51/0017* (2013.01); *H01L 51/0541* (2013.01); *H01L 51/0545* (2013.01); *H01L 51/0558* (2013.01); *H01L 51/0026* (2013.01); *H01L 51/0076* (2013.01)

(58) Field of Classification Search
CPC ............ H01L 51/0014; H01L 51/0015; H01L 51/0026; H01L 21/31058
See application file for complete search history.

(56) References Cited

FOREIGN PATENT DOCUMENTS

| | | |
|---|---|---|
| JP | 2003-058077 A | 2/2003 |
| JP | 2005-173048 A | 6/2005 |
| JP | 2005-294530 A | 10/2005 |
| JP | 2008-034578 A | 2/2008 |
| JP | 2008-270494 A | 11/2008 |
| JP | 2008-277381 A | 11/2008 |
| JP | 2009-122681 A | 6/2009 |
| JP | 2009-197218 A | 9/2009 |
| WO | 2006/048092 A1 | 5/2006 |
| WO | 2008/131836 A1 | 11/2008 |

OTHER PUBLICATIONS

International Search Report mailed Jun. 5, 2012; PCT/JP2012/059929.

*Primary Examiner* — Allen Parker

(74) *Attorney, Agent, or Firm* — Ladas & Parry LLP

(57) ABSTRACT

A method for manufacturing an organic semiconductor element, capable of obtaining an organic semiconductor element in which an organic semiconductor layer is easily patterned without being lowered in mobility, which includes: a source electrode and drain electrode formation step; an organic semiconductor layer formation step of forming an organic semiconductor layer having the liquid crystal organic semiconductor material on the alignment layer to cover the source electrode and the drain electrode; a dielectric layer formation step of forming a dielectric layer on the organic semiconductor layer to be positioned at least on a channel region between the source electrode and the drain electrode; and an annealing step of annealing the organic semiconductor layer, on which the dielectric layer is formed, at a liquid crystal phase temperature of the liquid crystal organic semiconductor material.

5 Claims, 6 Drawing Sheets

METHOD FOR MANUFACTURING ORGANIC SEMICONDUCTOR ELEMENT

TECHNICAL FIELD

The present invention relates to an organic semiconductor element in which an organic transistor is formed on a substrate, and a method for manufacturing the element.

BACKGROUND ART

In recent years, about semiconductor transistors, typical example of which are TFTs, the scope of articles to which the transistors are used tends to be enlarged with the development of display devices. In such a semiconductor transistor, its electrodes are connected to each other through the material of its semiconductor, so that the transistor fulfills a function as a switching element.

Hitherto, the semiconductor material used in the semiconductor transistor has been an inorganic semiconductor material such as silicon (Si), gallium arsenic (GaAs), or indium gallium arsenic (InGaAs). In recent years, semiconductor transistors in which such an inorganic semiconductor material is used have been used in TFT array substrates for display, the use of which has been spreading in liquid crystal display devices.

As the semiconductor material, an organic semiconductor material made of an organic compound has also been known. The organic semiconductor material is low in process temperature, so that the material can be formed on a flexible plastic substrate. Thus, the material has advantages that the material is stable against mechanical impacts, and can be made light. Moreover, the material can be produced through a coating process such as printing, so that the material may be mass-produced into a larger area at lower costs than the inorganic semiconductor material. Accordingly, the following activities in which such organic semiconductor materials are objects have been actively made: applications of the organic semiconductor materials to next-generation display devices, such as flexible disks, typical examples of which are electronic papers; and researches in which print RFID tags and others are targeted.

At the time of manufacturing an organic transistor in which an organic semiconductor material is used, it is usually necessary to pattern its organic semiconductor layer. As a method for patterning the organic semiconductor layer, an ink-jetting method and others have been reported. However, the methods require the step of forming a hydrophilic/hydrophobic pattern on a substrate, the step of forming partition walls thereon, or some other step. However, there is caused a problem that when the organic semiconductor layer undergoes such a step, this layer is declined in mobility.

Separately, attempts have been made for forming an organic semiconductor layer on the whole of a surface and then forming a protective layer thereon, and further inactivating its portion not protected by the protective layer as a mask, or removing the organic semiconductor layer partially (see, for example, Patent Literatures 1 to 4). As a method for the inactivation, investigations have been made about plasma treatment, the use of an oxidizer, and others. As a method for the removal, investigations have been made about laser radiation, and others.

However, when an organic semiconductor element is manufactured, these methods require its organic semiconductor layer to be patterned by inactivating or removing the organic semiconductor layer. Thus, the process thereof becomes complicated, and costs are increased.

Known is also a method of using a liquid crystal organic semiconductor material, and patterning an organic semiconductor layer by hydrophilic/hydrophobic patterning, a transferring method or some other method (see, for example, Patent Literatures 5 and 6).

CITATION LIST

Patent Literatures

Patent Literature 1: WO 2006/048092 pamphlet
Patent Literature 2: WO 2008/131836 pamphlet
Patent Literature 3: Japanese Patent Application Laid-Open (JP-A) No. 2008-277381
Patent Literature 4: JP-A No. 2008-270494
Patent Literature 5: JP-A No. 2005-294530
Patent Literature 6: JP-A No. 2009-200479

SUMMARY OF INVENTION

Technical Problem

In light of the above-mentioned actual circumstances, the present invention has been made, and a main object thereof is to provide an organic semiconductor element manufacturing method capable of obtaining an organic semiconductor element in which an organic semiconductor layer is easily patterned without being lowered in mobility.

Solution to Problem

In order to attain the object, the invention provides a method for manufacturing an organic semiconductor element, comprising steps of: a source electrode and drain electrode formation step of forming a source electrode and a drain electrode on an alignment layer for aligning a liquid crystal organic semiconductor material; an organic semiconductor layer formation step of forming an organic semiconductor layer including the liquid crystal organic semiconductor material on the alignment layer to cover the source electrode and the drain electrode; a dielectric layer formation step of forming a dielectric layer on the organic semiconductor layer to be positioned at least on a channel region between the source electrode and the drain electrode; and an annealing step of annealing the organic semiconductor layer, on which the dielectric layer is formed, at a liquid crystal phase temperature of the liquid crystal organic semiconductor material.

According to the invention, the manufacturing method thereof has the annealing step, whereby the aggregate of the liquid crystal organic semiconductor material is formed on the alignment layer and in the dielectric-layer-nonformed region, so that this region has no organic semiconductor layer. By contrast, no aggregate of the liquid crystal organic semiconductor material is formed on the alignment layer and in the dielectric-layer-formed region thereof, so that this region has the organic semiconductor layer. Thus, the organic semiconductor layer can easily be patterned without being lowered in mobility. Additionally, the workpiece is annealed at the liquid crystal phase temperature; thus, in the organic semiconductor layer, the aligning treatment of the liquid crystal organic semiconductor material can be simultaneously attained.

In the invention, the manufacturing method thereof may have, before the source electrode and drain electrode formation step, an alignment layer formation step of using an electrode laminated body having a substrate, a gate electrode formed on the substrate and a gate insulating layer on the substrate to cover the gate electrode, and forming the above-mentioned alignment layer on the gate insulating layer of the electrode laminated body. When the method has this alignment layer formation step, an organic semiconductor element of a bottom-gate/bottom-contact type can be formed.

In the invention, it is preferred that the alignment layer is a layer capable of aligning the liquid crystal organic semiconductor material vertically. When the alignment layer has this vertically aligning property, the liquid crystal organic semiconductor material can be vertically aligned in the organic semiconductor layer formed on the alignment layer. This matter makes it possible to improve, in the organic semiconductor layer, the mobility of electric charges in the in-plane direction of the layer. For this reason, the invention makes it possible to manufacture an organic semiconductor element excellent in transistor properties.

The invention also provides an organic semiconductor element comprising: an alignment layer for aligning a liquid crystal organic semiconductor material; a source electrode and a drain electrode formed on the alignment layer; an organic semiconductor layer including the liquid crystal organic semiconductor material and formed on the alignment layer to cover the source electrode and the drain electrode; and a dielectric layer formed on the organic semiconductor layer to be positioned at least on a channel region between the source electrode and the drain electrode; wherein an aggregate of the liquid crystal organic semiconductor material is formed on the alignment layer to be positioned in a dielectric-layer-nonformed region where the dielectric layer is not formed.

According to the invention, the aggregate of the liquid crystal organic semiconductor material is formed on the alignment layer and in the dielectric-layer-nonformed region, so that this region has no organic semiconductor layer. By contrast, no aggregate of the liquid crystal organic semiconductor material is formed on the alignment layer and in the dielectric-layer-formed region thereof, so that this region has the organic semiconductor layer. Thus, this element can be an organic semiconductor element in which its organic semiconductor layer is satisfactorily patterned in accordance with whether or not a dielectric layer is formed on the organic semiconductor layer. Additionally, in the organic semiconductor layer formed on the alignment layer for aligning the liquid crystal organic semiconductor material, this liquid crystal semiconductor material can be aligned so that the organic semiconductor layer can be improved in mobility. Accordingly, this element can be an organic semiconductor element excellent in transistor properties.

In the invention, it is allowable that an electrode laminated body having a substrate, a gate electrode formed on the substrate, and a gate insulating layer formed on the substrate to cover the gate electrode, wherein the alignment layer is formed on the gate insulating layer of the electrode laminated body. When the organic semiconductor element of the invention has this structure, the organic semiconductor element can be rendered an organic semiconductor element of a bottom-gate/bottom-contact type.

Advantageous Effects of Invention

The invention produces an advantageous effect capable of yielding an organic semiconductor element in which an organic semiconductor layer is easily patterned without being lowered in mobility.

DESCRIPTION OF EMBODIMENTS

Hereinafter, a detailed description will be made about the method of the invention for manufacturing an organic semiconductor element, and the organic semiconductor element thereof.

A. Method for Manufacturing an Organic Semiconductor Element

First, the method of the invention for manufacturing an organic semiconductor element is described. The organic semiconductor element manufacturing method of the invention comprises steps of: a source electrode and drain electrode formation step of forming a source electrode and a drain electrode on an alignment layer for aligning a liquid crystal organic semiconductor material; an organic semiconductor layer formation step of forming an organic semiconductor layer having the liquid crystal organic semiconductor material on the alignment layer to cover the source electrode and the drain electrode; a dielectric layer formation step of forming a dielectric layer on the organic semiconductor layer to be positioned at least on a channel region between the source electrode and the drain electrode; and an annealing step of annealing the organic semiconductor layer, on which the dielectric layer is formed, at a liquid crystal phase temperature of the liquid crystal organic semiconductor material.

Figure 1A:
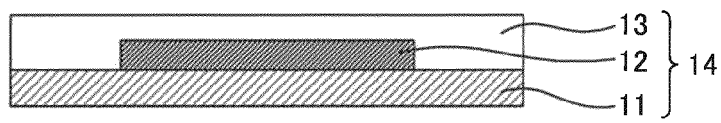
FIGS. 1A to 1F are a process chart illustrating an example of the organic semiconductor element manufacturing method of the invention.

With reference to some of the drawings, the organic semiconductor element manufacturing method of the invention is described. FIGS. 1A to 1F are a process chart illustrating an example of the organic semiconductor element manufacturing method of the invention. As illustrated in FIGS. 1A to 1F, in this organic semiconductor element manufacturing method according to the invention, an electrode laminated body 14 is used which has a substrate 11, a gate electrode 12 formed on the substrate 11, and a gate insulating layer 13 formed on the substrate 11 to cover the gate electrode 12 (FIG. 1A). This manufacturing method further comprises: an alignment layer formation step (FIG. 1B) of forming an alignment layer 1 for aligning a liquid crystal organic semiconductor material on the gate insulating layer 13 of the electrode laminated body 14; a source electrode and drain electrode formation step (FIG. 1C) of forming a source electrode 2 and a drain electrode 3 on the alignment layer 1; an organic semiconductor layer formation step (FIG. 1D) of forming, on the alignment layer 1, an organic semiconductor layer 4 having the liquid crystal organic semiconductor material to cover the source electrode 2 and the drain electrode 3; a dielectric layer formation step (FIG. 1E) of forming a dielectric layer 5 on the organic semiconductor layer 4 to be positioned at least on a channel region C between the source electrode 2 and the drain electrode 3; and an annealing step (not illustrated) of annealing the organic semiconductor layer 4, on which the dielectric layer 5 is formed, a of liquid crystal phase temperature of the liquid crystal organic semiconductor material. In this way, an organic semiconductor element 10 is manufactured (FIG. 1F). Furthermore, as illustrated in FIG. 1F, in the organic semiconductor element 10 manufactured by the organic semiconductor element manufacturing method according to the invention, grains of an aggregate 6 of the liquid crystal organic semiconductor material are formed on the alignment layer 1 to be positioned in a dielectric-layer-nonformed region X of the alignment layer 1, where the dielectric layer 5 is not formed.

According to the invention, the annealing step is performed, whereby the aggregate of the liquid crystal organic semiconductor material is formed on the alignment layer and in the dielectric-layer-nonformed region, so that this region has no organic semiconductor layer. By contrast, no aggregate of the liquid crystal organic semiconductor material is formed on the alignment layer and in the dielectric-layer-formed region thereof, so that this region has the organic semiconductor layer. Thus, the organic semiconductor layer can easily be patterned without being lowered in mobility. Additionally, the workpiece is annealed at the liquid crystal phase temperature; thus, in the organic semiconductor layer, the aligning treatment of the liquid crystal organic semiconductor material can be simultaneously attained.

The organic semiconductor element manufacturing method of the invention comprises at least the source electrode and drain electrode formation step, the organic semiconductor layer formation step, the dielectric layer formation step, and the annealing step. If necessary, the method may comprise one or more optional different steps.

Hereinafter, a description will be made about each of the steps in the organic semiconductor element manufacturing method of the invention.

1. Source Electrode and Drain Electrode Formation Step

First, a description is made about the source electrode and drain electrode formation step in the invention. The step is a step of forming a source electrode and a drain electrode on an alignment layer for aligning a liquid crystal organic semiconductor material.

The alignment layer used in the step is a layer having a function for aligning a liquid crystal organic semiconductor material. The alignment layer is not particularly limited as far as the layer is a layer making it possible to align a liquid crystal organic semiconductor material contained in an organic semiconductor layer to be formed in the organic semiconductor layer formation step, which will be detailed later. In accordance with the species of the liquid crystal organic semiconductor material, the alignment layer is appropriately selected to be usable. Examples of this alignment layer include a parallel alignment membrane for aligning the liquid crystal organic semiconductor material on the alignment layer in parallel to the front surface of the alignment layer, and a vertical alignment membrane for aligning the liquid crystal organic semiconductor material on the alignment layer vertically to the front surface of the alignment layer.

The parallel alignment membrane is not particularly limited as far as the membrane is a membrane making it possible to align the liquid crystal organic semiconductor material into the predetermined direction. Examples of the parallel alignment membrane include a rubbed membrane subjected to rubbing treatment to succeed in the supply of a function of aligning the liquid crystal organic semiconductor material into the rubbing direction; and a photo alignment membrane which includes a photoreactive material and is irradiated with polarized light to succeed in the supply of a function of aligning the liquid crystal organic semiconductor material into a given direction.

Examples of the rubbed membrane include membranes each made of polyimide, polyamide, polyvinyl alcohol, polyvinyl phenol, polyester or nylon.

Examples of the photo alignment membrane include membranes each made of polyimide, polyamide or polyvinyl cinnamate.

The above-mentioned vertical alignment membrane is not particularly limited as far as the membrane is a membrane making it possible to align the liquid crystal organic semiconductor material in a direction vertical to the front surface of the alignment layer. Examples of the vertical alignment membrane include membranes each made of polyimide, fluoropolymer, a silane coupling agent, or silicone polymer.

As the alignment layer used in the step, either the parallel alignment membrane or the vertical alignment membrane is preferably usable. It is particularly preferred to use, out of the two, the vertical alignment membrane. The use of the vertical alignment membrane as the alignment layer makes it possible to improve the mobility in the in-plane direction of the organic semiconductor layer formed on the alignment layer to improve the transistor performance of the organic semiconductor element manufactured by the invention.

The thickness of the alignment layer used in the step is not particularly limited as far as the thickness is within a range permitting the layer to gain a desired aligning function in accordance with the species of the alignment membrane used as the alignment layer, and other factors. Usually, the thickness ranges preferably from 1 nm to 1 µm, more preferably from 1 nm to 0.5 µm, and even more preferably from 1 nm to 0.1 µm.

The source electrode and the drain electrode used in the step are electrodes formed on the alignment layer to be usually opposed to each other at a given interval. The interval set between the source electrode and the drain electrode creates a channel region. The constituent material of the source electrode and the drain electrode is not particularly limited as far as the material is a conductive material having a desired conductivity. Examples of the conductive material include inorganic materials such as Ta, Ti, Al, Zr, Cr, Nb, Hf, Mo, Au, Ag, Pt, Cu, Mo—Ta alloy, ITO (indium tin oxide), and IZO (indium zinc oxide); and conductive organic materials such as PEDOT/PSS (polyethylene dioxythiophene/polystyrene sulfonic acid). The source electrode and the drain electrode may be made of a single conductive material or two or more conductive materials. In the source electrode and the drain electrode, the same conductive material may be used, or conductive materials different from each other may be used.

In the step, the method for forming the source electrode and the drain electrode is not particularly limited as far as the method makes it possible to form each of the source electrode and the drain electrode to have a shape decided in advance, using a desired conductive material. Examples of the method include CVD methods such as plasma CVD, thermal CVD and laser CVD, PVD methods such as vacuum deposition, sputtering and ion plating, and other dry methods; and electroplating, immersion plating, electroless plating, a sol-gel method, a metal organic decomposition (MOD) method, spin coating, blade coating, dipping, spray coating, ink-jetting, flexography, micro-contact printing, screen printing, offset printing, gravure printing, and other wet methods.

Between the source electrode and the drain electrode formed through the step, a channel region is formed. Usually, the distance between the source electrode and the drain electrode ranges preferably from 0.1 µm to 1 mm, more preferably from 0.5 µm to 200 µm, and even more preferably from 1 µm to 100 µm.

The thickness of the source electrode and the drain electrode formed through the step is not particularly limited as far as the thickness is within a range permitting the electrodes to attain a desired electric resistance in accordance with the species of the used conductive material. Usually, the thickness ranges preferably from 1 nm to 1 µm, more preferably from 10 nm to 200 nm, and even more preferably from 20 nm to 100 nm.

2. Organic Semiconductor Layer Formation Step

The following describes the organic semiconductor layer formation step in the invention. The step is a step of forming an organic semiconductor layer having a liquid crystal organic semiconductor material on the alignment layer to cover the source electrode and the drain electrode.

The organic semiconductor layer formed through the step is a layer having a liquid crystal organic semiconductor material. The liquid crystal organic semiconductor material used in the step is not particularly limited as far as the material is a material having semiconductor properties, and exhibiting a liquid crystal phase at a predetermined temperature. The material is appropriately selected in accordance with factors such as a use purpose of the organic semiconductor element manufactured by the invention, so as to be usable. In particular, about the liquid crystal organic semiconductor material used in the step, liquid crystal phase temperatures thereof, at which the material exhibits a liquid crystal phase, are preferably 450° C. and lower, more preferably 300° C. and lower, and even more preferably 200° C. and lower. The liquid crystal phase temperatures are usually 40° C. and higher.

The liquid crystal phase temperatures mean temperatures at which the liquid crystal organic semiconductor material exhibits a liquid crystal phase. The liquid crystal phase temperatures are measurable by, for example, thermal analysis by differential scanning calorimetry (DSC), or texture observation through a polarizing microscope.

The liquid crystal organic semiconductor material used in the step can be classified into a high-molecular-weight liquid crystal organic semiconductor material and a low-molecular-weight liquid crystal organic semiconductor material. In the step, either the high-molecular-weight liquid crystal organic semiconductor material or the low-molecular-weight liquid crystal organic semiconductor material is preferably usable.

Examples of the high-molecular-weight liquid crystal organic semiconductor material include polythiophene derivatives, polyphenylene derivatives, polyaniline derivatives, polyphenylene vinylene derivatives, polythienylenevinylene derivatives, polyacetylene derivatives, polydiacetylene derivatives, polytriphenylamine derivatives, copolymer derivatives each made from triphenylamine and phenylenevinylene, copolymer derivatives each made from thiophene and phenylene, copolymer derivatives each made from thiophene and thienothiophene, and copolymer derivatives each made from thiophene and fluorene.

Examples of the low-molecular-weight liquid crystal organic semiconductor material include oligochalcogenophene derivatives, oligophenylene derivatives, cooligomer derivatives each made from chalcogenophene and phenylene, condensed cyclic compound derivatives of chalcogenophene, such as tetrathienoacene, condensed cyclic compound derivatives each made from chalcogenophene and phenylene, condensed polycyclic hydrocarbon derivatives such as anthracene, tetracene, pentacene, pyrene, triphenylene and coronene, cooligomer derivatives each made from chalcogenophene and a condensed polycyclic hydrocarbon, phthalocyanine derivatives, porphyrin derivatives, tetrathiofulvalene derivatives, triphenylamine derivatives, tetracyanoquinodimethane derivatives, benzoquinone derivatives, thiazolothiazole derivatives, anthradithiophene derivatives, benzothienobenzothiophene derivatives, dinaphthothienothiophene derivatives, and fullerene derivatives.

In the invention, the liquid crystal organic semiconductor material used in the step is in particular preferably the low-molecular-weight liquid crystal organic semiconductor material.

About the liquid crystal organic semiconductor material, only a single species thereof, or two or more species thereof may be used in the step.

The method for forming the organic semiconductor layer in the step is not particularly limited as far as the method is a method capable of forming this layer as a desired organic semiconductor layer at least on the alignment layer on which the source electrode and the drain electrode are formed to cover the source electrode and the drain electrode. Examples of this method include spin coating, blade coating, dipping, spray coating, ink-jetting, flexography, micro-contact printing, screen printing, offset printing and gravure printing in each of which an organic-semiconductor-layer-forming coating liquid that contains a liquid crystal organic semiconductor material is used and this coating liquid is coated onto the whole of the surface of the alignment layer on which the source electrode and the drain electrode are formed.

The thickness of the organic semiconductor layer formed through the step is not particularly limited as far as the thickness is within a range permitting the formed organic semiconductor layer to have a desired semiconductor property in accordance with the species of the organic semiconductor material, and other factors. Usually, the thickness ranges preferably from 1 nm to 1000 nm, more preferably from 5 nm to 500 nm, and even more preferably from 10 nm to 300 nm.

3. Dielectric Layer Formation Step

The following describes the dielectric layer formation step in the invention. The step is a step of forming a dielectric layer on the organic semiconductor layer to be positioned at least on a channel region between the source electrode and the drain electrode.

The material of the dielectric layer used in the step is not particularly limited as far as the material is a material which has insulating performance, and does not invade the organic semiconductor layer. Examples of the material include fluororesins such as PTFE™ and CYTOP™ (manufactured by Asahi Glass Co., Ltd.), acrylic resins, phenolic resins, epoxy resins, cardo resins, vinyl resins, imide resins, and novolak resins. Among these examples, fluororesins are preferred, which are soluble in a fluorine-containing solvent that does not produce any effect at all onto the organic semiconductor layer. About the material of the dielectric layer, only a single species thereof, or two or more species thereof may be used in the step.

The method for forming the dielectric layer in the step is not particularly limited as far as the method makes it possible to form this layer as a desired dielectric layer on the organic semiconductor layer to be positioned at least on the channel region between the source electrode and the drain electrode. Examples of the method include a method of using a dielectric-layer-forming coating liquid containing a material of the dielectric layer, and a solvent which does not produce any effect onto the organic semiconductor layer, such as a fluorine-containing solvent, and coating this coating liquid onto the organic semiconductor layer by a printing method such as screen printing; and a method of using a target of a material of the dielectric layer, and depositing the material onto the organic semiconductor layer by a CVD method such as plasma CVD, thermal CVD or laser CVD, or a vapor deposition method such as vacuum deposition, sputtering or ion plating.

The thickness of the dielectric layer formed through the step is not particularly limited as far as the thickness is within a range permitting, in the annealing step, which will be detailed later, the prevention of both the outflow of the organic semiconductor layer and the formation of an aggregate of the liquid crystal organic semiconductor material. Usually, the thickness ranges preferably from 10 nm to 100 µm, more preferably from 50 nm to 10 µm, and even more preferably from 100 nm to 1 µm.

4. Annealing Step

The following describes the annealing step. The step is a step of annealing the organic semiconductor layer on which the dielectric layer is formed at the liquid crystal phase temperature of the liquid crystal organic semiconductor material. By performing the step, an aggregate of the liquid crystal organic semiconductor material is formed on the alignment layer to be positioned in a dielectric-layer-nonformed region where the dielectric layer is not formed. In this way, the organic semiconductor layer can easily be patterned without being lowered in mobility.

The reason why the organic semiconductor layer can easily be patterned without being lowered in mobility through the step would be as follows. About the organic semiconductor layer of the region where the dielectric layer is formed, the liquid crystal organic semiconductor material is not caused to flow out by surface tension even when the liquid crystal organic semiconductor material comes to have fluidity by the annealing at the liquid crystal phase temperature; this is because the organic semiconductor layer has, on the front surface thereof, the dielectric layer. Thus, the organic semiconductor layer can keep the thin-film-form thereof. By contrast, about the organic semiconductor layer of the region where the dielectric layer is not formed, the front surface of the organic semiconductor layer is lost when the liquid crystal organic semiconductor material comes to have fluidity by the annealing at the liquid crystal phase temperature. Thus, the liquid crystal organic semiconductor material flows out so that the organic semiconductor layer cannot keep the thin-film-form thereof. Consequently, an aggregate thereof is formed. As a result, the organic semiconductor layer can be automatically patterned without being lowered in mobility.

Since the annealing is performed at the liquid crystal phase temperature, the alignment treatment of the liquid crystal organic semiconductor material can also be simultaneously made in the organic semiconductor layer. This matter makes it possible to arrange the liquid crystal organic semiconductor material regularly in the organic semiconductor layer to improve the mobility of the organic semiconductor layer. In the invention, the organic semiconductor layer is formed on the alignment layer for aligning the liquid crystal organic semiconductor material; it is therefore possible to stabilize the alignment property of the liquid crystal organic semiconductor material in the organic semiconductor layer even after the annealing.

The method for the annealing that is used in the step is characterized by annealing the organic semiconductor layer on which the dielectric layer is formed at the liquid crystal phase temperature of the liquid crystal organic semiconductor material. The liquid crystal phase temperature is the same as described in the subitem "2. Organic semiconductor layer formation step"; thus, any description thereabout is omitted herein.

The annealing temperature in the step is not particularly limited as far as the temperature is within the liquid crystal phase temperatures. Specifically, the annealing temperature can be appropriately decided in accordance with the species of the liquid crystal organic semiconductor material, and other factors.

The annealing period in the step is not particularly limited as far as the period makes it possible to form the aggregate of the liquid crystal organic semiconductor material on the alignment layer to be positioned in the dielectric-layer-nonformed region where the dielectric layer is not formed. Specifically, the annealing period can be appropriately decided in accordance with the species of the liquid crystal organic semiconductor material, and other factors. Usually, the period ranges from 1 second to 24 hours.

The atmosphere for the annealing in the step is, for example, an atmospheric atmosphere, an inert gas atmosphere such as nitrogen gas or argon gas, or a vacuum. Among these atmospheres, atmospheric, and inert gas atmospheres are preferred.

By performing the step in the invention, an aggregate of the liquid crystal organic semiconductor material are formed on the alignment layer to be usually positioned in the dielectric-layer-nonformed region where the dielectric layer is not formed. The form of the aggregate is, for example, a granular form. When the aggregate is granular, usually, the average grain diameter thereof is preferably 1000 µm or less, more preferably 100 µm or less, even more preferably 10 µm or less although the diameter is not particularly limited. The average particle diameter is measurable by, for example, observation through a polarizing microscope.

5. Different Step(s)

The organic semiconductor element manufacturing method of the invention comprises at least the source electrode and drain electrode formation step, the organic semiconductor layer formation step, the dielectric layer formation step, and the annealing step. If necessary, the method may comprise one or more different steps. The different step(s) used in the invention is/are not particularly limited, and may be (each) any step in accordance with a use purpose of the organic semiconductor element manufactured in the invention, and other factors. As the different step, the invention may have, before the source electrode and drain electrode formation step, the alignment layer formation step, which is a step of using an electrode laminated body having a substrate, a gate electrode formed on the substrate and a gate insulating layer formed on the substrate to cover the gate electrode, and forming the above-mentioned alignment layer onto the gate insulating layer of the electrode laminated body. When the invention has the alignment layer formation step, an organic semiconductor element of a bottom-gate/bottom-contact type can be formed.

Figure 1B:
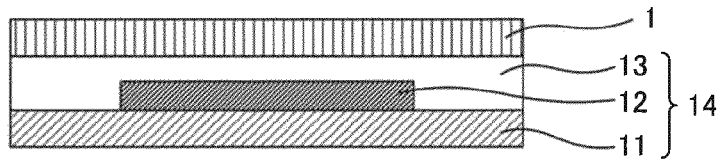
Figure 1C:
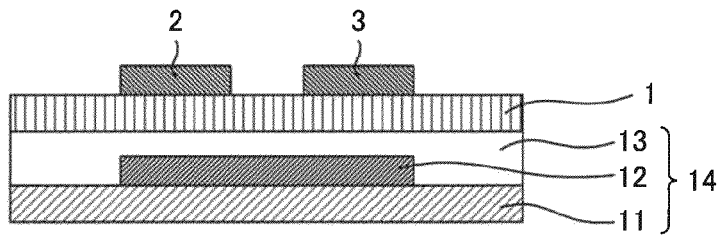
Figure 1D:
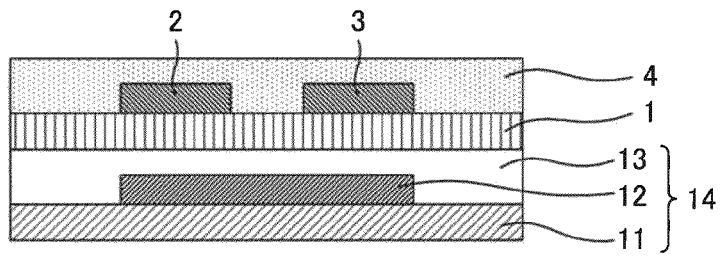
Figure 1E:
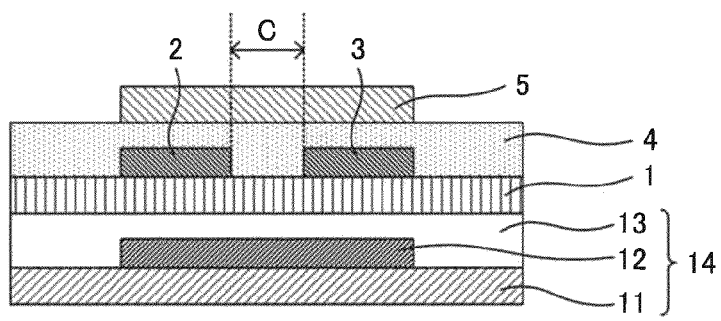
Figure 1F:
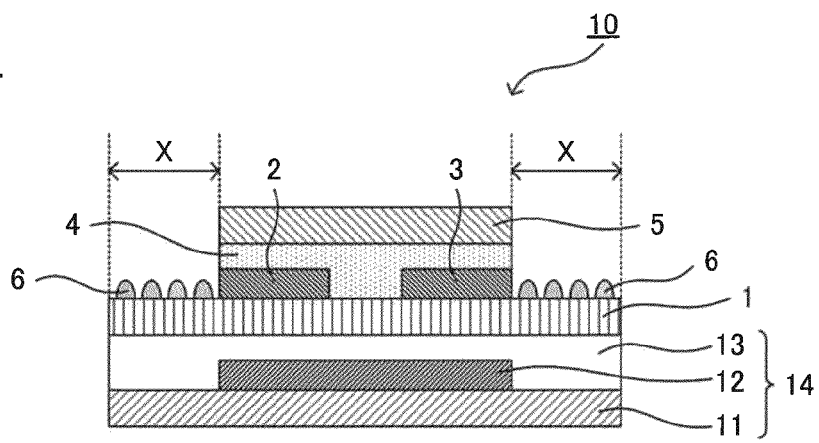

When the organic semiconductor element manufacturing method of the invention comprises the alignment layer formation step, for example, the following are performed as has been illustrated in FIGS. 1A to 1F. The electrode laminated body 14 is used, which has the substrate 11, the gate electrode 12 formed on the substrate 11, and the gate insulating layer 13 formed on the substrate 11 to cover the gate electrode 12 (FIG. 1A). The alignment layer 1 for aligning a liquid crystal organic semiconductor material is formed on the gate insulating layer 13 of the electrode laminated body 14 (FIG. 1B, alignment layer formation step). The source electrode 2 and the drain electrode 3 are formed on the alignment layer 1 (FIG. 1C, source electrode and drain electrode formation step). The organic semiconductor layer 4 is formed to cover the source electrode 2 and the drain electrode 3 (FIG. 1D, organic semiconductor layer formation step). The dielectric layer 5 is formed on the organic semiconductor layer 4 to be positioned at least on the channel region C between the source electrode 2 and the drain electrode 3 (FIG. 1E, dielectric layer formation step). The organic semiconductor layer 4, on which the dielectric layer 5 is formed, is annealed at the liquid crystal phase temperature of the liquid crystal organic semiconductor material (not illustrated, annealing step). In this way, the organic semiconductor element 10 is manufactured (FIG. 1F). At this time, in the organic semiconductor element 10 illustrated in FIG. 1F, the grains of the aggregate 6 of the liquid crystal organic semiconductor material are formed on the alignment layer 1 to be positioned in the dielectric-layer-nonformed region X of the alignment layer 1, where the dielectric layer 5 is not formed.

The substrate used in the electrode laminated body is not particularly limited, and may be appropriately decided in accordance with a use purpose of the organic semiconductor element manufactured according to the invention, and other factors. Accordingly, the substrate may be a flexible substrate, which has flexibility, or may be a rigid substrate, which has no flexibility. Specific examples of the substrate include substrates each made of polyimide, polyethylene naphthalate, polyethylene terephthalate, polyethersulfone, polycarbonate, polyetherimide, polyetheretherketone, polyetherketone, polyphenylene sulfide, liquid crystal polymer, epoxy resin, silicone resin, or phenolic resin; a glass substrate; and a SUS substrate.

The thickness of the substrate is appropriately decided in accordance with the species of the substrate, and other factors. Usually, the thickness is preferably 1 mm or less, and ranges in particular preferably from 1 μm to 70 μm.

The gate electrode used in the electrode laminated body is an electrode formed on the substrate. The gate electrode is usually formed into a predetermined pattern on the substrate. The gate electrode is not particularly limited as far as the electrode is made of a conductive material having a desired conductivity. The material may be a conductive material that is generally used for a gate electrode of an organic transistor. Examples of the conductive material include inorganic materials such as Ta, Ti, Al, Zr, Cr, Nb, Hf, Mo, Au, Ag, Pt, Mo—Ta alloy, ITO, and IZO; and conductive organic materials such as PEDOT/PSS.

The thickness of the gate electrode is appropriately decided within a range permitting the electrode to attain a desired conductivity in accordance with the species of the conductive material used to form the gate electrode, and other factors. Usually, the thickness ranges preferably from 10 nm to 1 μm.

The gate insulating layer used in the electrode laminated body is a layer formed on the substrate to cover the gate electrode. This layer is also a layer having a function of insulating the source electrode and the drain electrode electrically from the gate electrode in the organic semiconductor element manufactured according to the invention. The material constituting the gate insulating layer is not particularly limited as far as the material is an insulating material having a desired insulating performance. Examples of the insulating material include organic materials such as acrylic resins, phenolic resins, fluororesins, epoxy resins, cardo resins, vinyl resins, imide resins, novolak resins, and polyparaxylene; and inorganic materials such as $SiO_2$ (silicon dioxide), $SiN_x$ (silicon nitride), and $Al_2O_3$ (aluminum oxide). About the insulating material, only a single species thereof, or two or more species thereof may be used in the gate insulating layer.

The thickness of the gate insulating layer is appropriately decided within a range permitting the layer to attain a desired insulating performance in accordance with the species of the insulating material used to form the gate insulating layer, and other factors. Usually, the thickness ranges preferably from 10 nm to 5 μm.

The method for forming the alignment layer in the alignment layer formation step is not particularly limited as far as the method is a method making it possible to form the layer as a layer for aligning the liquid crystal organic semiconductor material into a desired direction. Examples of the method include spin coating, blade coating, dipping, immersing, spray coating, ink-jetting, flexographic, micro-contact printing, screen printing, offset printing and gravure printing methods.

In the alignment layer formation step, the constituent material used to form the alignment layer, and the thickness of the formed alignment layer are the same as described in the item "A. Method for manufacturing an organic semiconductor element"; thus, any description thereabout is omitted herein.

As the above-mentioned different steps, the invention may comprise the following steps: the alignment layer formation step, which is a step of using a substrate and forming the above-mentioned alignment layer onto the substrate, before the organic semiconductor layer formation step; and a gate electrode formation step of forming a gate electrode on the above-mentioned dielectric layer between the dielectric layer formation step and the annealing step. When the invention has the alignment layer formation step and the gate electrode formation step, an organic semiconductor element of a top-gate/bottom-contact type can be formed.

Figure 2A:
FIGS. 2A to 2G are a process chart illustrating another example of the organic semiconductor element manufacturing method of the invention.
Figure 2B:
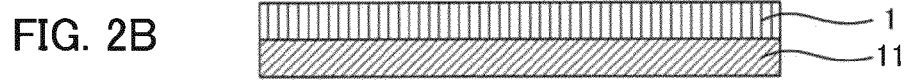
Figure 2C:
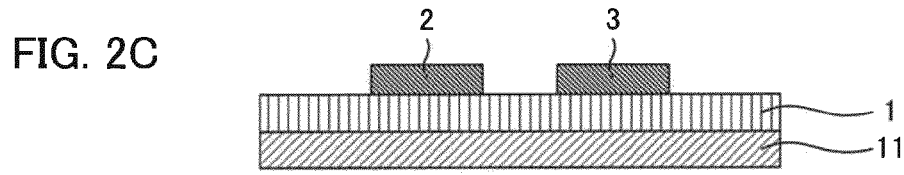
Figure 2D:
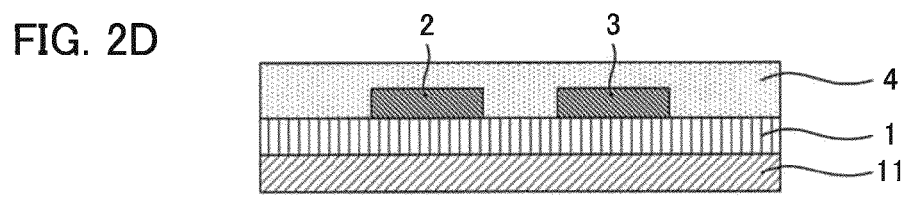
Figure 2E:
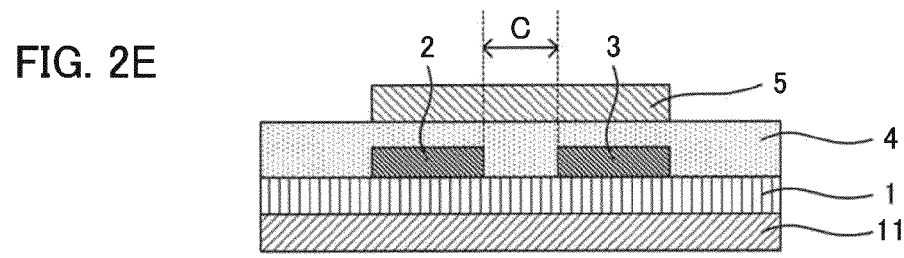
Figure 2F:
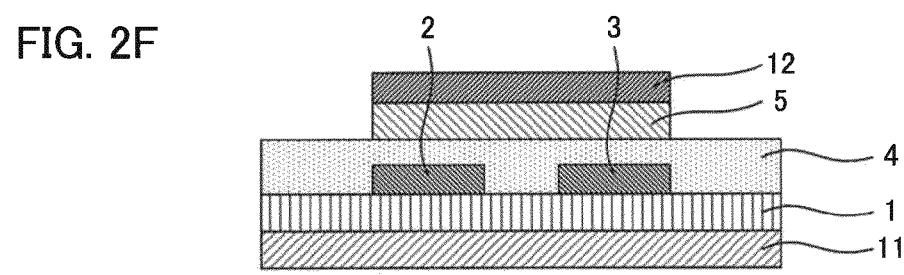
Figure 2G:
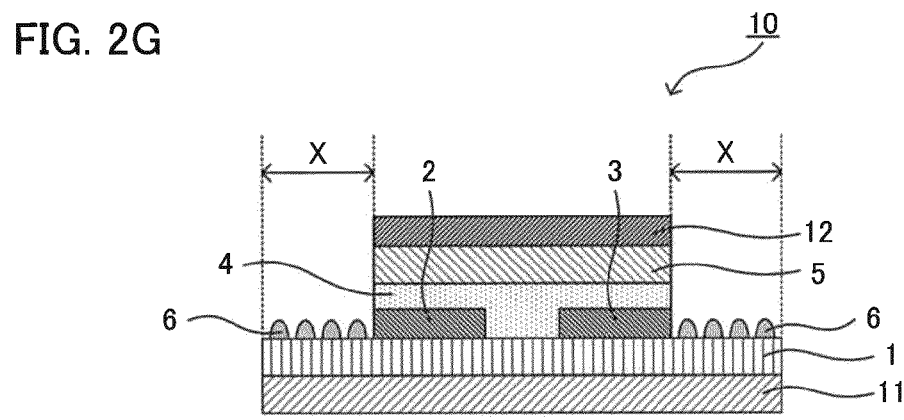

When the organic semiconductor element manufacturing method of the invention comprises the alignment layer formation step and the gate electrode formation step, for example, the following are performed as illustrated in FIGS. 2A to 2G. A substrate 11 is used (FIG. 2A), and an alignment layer 1 for aligning a liquid crystal organic semiconductor material is formed on the substrate 11 (FIG. 2B, alignment layer formation step). A source electrode 2 and a drain electrode 3 are formed on the alignment layer 1 (FIG. 2C, source electrode and drain electrode formation step), and then an organic semiconductor layer 4 is formed to cover the source electrode 2 and the drain electrode 3 (FIG. 2D, organic semiconductor layer formation step). A dielectric layer 5 is formed on the organic semiconductor layer 4 to be positioned at least on a channel region C between the source electrode 2 and the drain electrode 3 (FIG. 2E, dielectric layer formation step), and then a gate electrode 12 is formed on the dielectric layer 5 (FIG. 2F, gate electrode formation step). The organic semiconductor layer 4, on which the dielectric layer 5 and the gate electrode 12 are formed, is annealed at the liquid crystal phase temperature of the liquid crystal organic semiconductor material (not illustrated, annealing step). In this way, an organic semiconductor element 10 is manufactured (FIG. 2G). At this time, in the organic semiconductor element 10 illustrated in FIG. 2G, grains of an aggregate 6 of the liquid crystal organic semiconductor material are formed on the alignment layer 1 to be positioned in a dielectric-layer-non-formed-region X of the alignment layer 1, where the dielectric layer 5 is not formed. FIGS. 2A to 2G are a process chart illustrating this example, which is a different example of the organic semiconductor element manufacturing method of the invention.

In the alignment layer formation step, the respective materials of the used substrate and alignment layer, the method for forming the alignment layer, and thickness of the formed alignment layer are the same as described above.

The method for forming the gate electrode in the gate formation step is not particularly limited as far as the method is a method making it possible to form the gate electrode to have a shape decided in advance, using a desired conductive material. Examples of the method include CVD methods such as plasma CVD, thermal CVD and laser CVD, PVD methods such as vacuum deposition, sputtering and ion plating, and other dry methods; and electroplating, immersion plating, electroless plating, a sol-gel method, a metal organic decomposition (MOD) method, spin coating, blade coating, dipping, spray coating, ink-jetting, flexography, micro-contact printing, screen printing, offset printing, gravure printing, and other wet methods.

In the gate electrode formation step, the constituent material used to form the gate electrode, and the thickness of the formed gate electrode are the same as described above. In the invention, the manufacturing method may comprise the gate electrode formation step after the annealing step.

Furthermore, the invention may comprise, as the above-mentioned different step, a passivation layer formation step of forming a passivation layer on the organic semiconductor layer to cover the dielectric layer between the dielectric layer formation step and the annealing step, or after the annealing step. By the formation of the passivation layer, which has a function of preventing a deterioration of the organic semiconductor element with time, the organic semiconductor element manufactured by the invention can be rendered an element excellent in durability.

The constituent material of the passivation layer used in the passivation layer formation step is not particularly limited as far as the material is a material making it possible to prevent, into a desired degree, the exposure of the organic semiconductor layer to water and others contained in the air in the organic semiconductor element manufactured by the invention. Examples of the material include acrylic resins, phenolic resins, fluororesins, epoxy resins, cardo resins, vinyl resins, vinyl acetate resins, imide resins, and novolak resins.

The method for forming the passivation layer in the passivation layer formation step is not particularly limited as far as the method is a method making it possible to form the layer as a desired passivation layer on the organic semiconductor layer to cover the dielectric layer. Examples of the method include a wet method of using a passivation-layer-forming coating liquid which contains a constituent material of the passivation layer and a solvent which does not invade the material of the dielectric layer, and coating this coating liquid onto the organic semiconductor layer by a printing method, such as screen printing, to cover the dielectric layer; and a dry method of pressing and bonding the passivation layer thermally onto the organic semiconductor layer at a temperature and a pressure that do not permit the passivation layer to invade the respective materials of the organic semiconductor layer and the dielectric layer, so as to cover the dielectric layer.

The thickness of the passivation layer formed through the passivation layer formation step is not particularly limited, and is appropriately decided within a range permitting the layer to realize a desired durability in accordance with the species of the constituent material thereof, and other factors. Usually, the thickness ranges preferably from 1 µm to 50 µm.

B. Organic Semiconductor Element

The following describes the organic semiconductor element of the invention. The organic semiconductor element of the invention is an element comprising: an alignment layer for aligning a liquid crystal organic semiconductor material; a source electrode and a drain electrode formed on the alignment layer; an organic semiconductor layer having the liquid crystal organic semiconductor material and formed on the alignment layer to cover the source electrode and the drain electrode; and a dielectric layer formed on the organic semiconductor layer to be positioned at least on a channel region between the source electrode and the drain electrode; wherein an aggregate of the liquid crystal organic semiconductor material is formed on the alignment layer to be positioned in a dielectric-layer-nonformed region where the dielectric layer is not formed.

Figure 3:
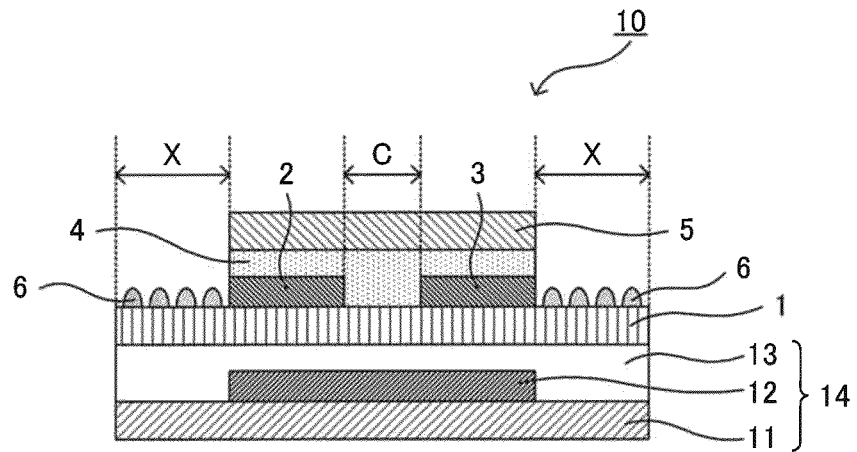
FIG. 3 is a schematic sectional view illustrating an example of the organic semiconductor element of the invention.

With reference to some of the drawings, the organic semiconductor element of the invention is described. FIG. 3 is a schematic sectional view illustrating an example of the organic semiconductor element of the invention. As illustrated in FIG. 3, an organic semiconductor element 10 of the invention comprises an electrode laminated body 14 having a substrate 11, a gate electrode 12 formed on the substrate 11 and a gate insulating layer 13 formed on the substrate 11 to cover the gate electrode 12; an alignment layer 1 formed on the gate insulating layer 13 of the electrode laminated body 14 to align a liquid crystal organic semiconductor material; a source electrode 2 and a drain electrode 3 formed on the alignment layer 1; an organic semiconductor layer 4 having the liquid crystal organic semiconductor material and formed on the alignment layer 1 to cover the source electrode 2 and the drain electrode 3; and a dielectric layer 5 formed on the organic semiconductor layer 4 to be positioned at least on a channel region C between the source electrode 2 and the drain electrode 3. In the organic semiconductor element 10 illustrated in FIG. 3, gains of an aggregate 6 of the liquid crystal organic semiconductor material are formed on the alignment layer 1 to be positioned in a dielectric-layer-nonformed region X of the alignment layer 1, where the dielectric layer 5 is not formed.

According to the invention, the aggregate of the liquid crystal organic semiconductor material is formed on the alignment layer and in the dielectric-layer-nonformed region, so that this region has no organic semiconductor layer. By contrast, no aggregate of the liquid crystal organic semiconductor material is formed on the alignment layer and in the dielectric-layer-formed region thereof, so that this region has the organic semiconductor layer. Thus, this element can be an organic semiconductor element in which its organic semiconductor layer is satisfactorily patterned in accordance with whether or not a dielectric layer is formed on the organic semiconductor layer. Additionally, in the organic semiconductor layer formed on the alignment layer for aligning the liquid crystal organic semiconductor material, this material can be aligned so that the organic semiconductor layer can be improved in mobility. Accordingly, this element can be an organic semiconductor element excellent in transistor properties.

The organic semiconductor element of the invention comprises at least the alignment layer, the source electrode and the drain electrode, the organic semiconductor layer, the dielectric layer, and the aggregate. If necessary, the element may comprise one or more different constituents.

Hereinafter, a description will be made about each of the constituents of the organic semiconductor element of the invention.

1. Organic Semiconductor Layer

First, the organic semiconductor layer in the invention is described. The organic semiconductor layer in the invention is a layer formed on an alignment layer to cover a source electrode and a drain electrode, and having a liquid crystal organic semiconductor material. The liquid crystal organic semiconductor material used in the invention is the same as described in the item "A. Method for manufacturing an organic semiconductor element"; thus, any description thereabout is omitted herein. The thickness and others of the organic semiconductor layer used in the invention are also the same as described in the item "A. Method for manufacturing an organic semiconductor element".

2. Dielectric Layer

The following describes the dielectric layer in the invention. The dielectric layer in the invention is a layer formed on the organic semiconductor layer to be positioned at least on a channel region between the source electrode and the drain electrode. The material, the thickness, and others of the dielectric layer used in the invention are the same as described in the item "A. Method for manufacturing an organic semiconductor element"; thus, any description thereabout is omitted herein.

3. Aggregate

The following describes the aggregate in the invention. The aggregate in the invention is a material formed on the alignment layer to be positioned in the dielectric-layer-nonformed region thereof, where no dielectric layer is formed, and is a material about which the liquid crystal organic semiconductor material aggregates. Details of the aggregate in the invention are the same as described in the item "A. Method for manufacturing an organic semiconductor element"; thus, any description thereabout is omitted herein.

4. Alignment Layer

The following describes the alignment layer in the invention. The alignment layer in the invention is a layer for aligning a liquid crystal organic semiconductor material. The material, the thickness and others of the alignment layer used in the invention are the same as described in the item "A. Method for manufacturing an organic semiconductor element"; thus, any description thereabout is omitted herein.

5. Source Electrode and Drain Electrode

The following describes the source electrode and the drain electrode in the invention. The source electrode and the drain electrode in the invention are electrodes formed on the alignment layer to be usually opposed to each other at a given interval therebetween. The interval set between the source electrode and the drain electrode creates a channel region. The material, the thickness and others of the source electrode and the drain electrode used in the invention, and the distance between the source electrode and the drain electrode are the same as described in the item "A. Method for manufacturing an organic semiconductor element"; thus, any description thereabout is omitted herein.

6. Organic Semiconductor Element

The organic semiconductor element of the invention comprises at least the alignment layer, the source electrode and the drain electrode, the organic semiconductor layer, the dielectric layer, and the aggregate. If necessary, the element may comprise one or more different constituents. The different constituent(s) used in the invention is/are not particularly limited. In accordance with a use purpose of the organic semiconductor element of the invention, the organic semiconductor element manufacturing method of the invention, and other factors, one or more constituents having a desired function are appropriately selected to be usable. In the invention, the different constituents are usually a substrate, a gate electrode, and a gate insulating layer. The substrate, the gate electrode, and the gate insulating layer are the same as described in the item "A. Method for manufacturing an organic semiconductor element"; thus, any description thereabout is omitted herein.

In the invention, an electrode laminated body having a substrate, a gate electrode formed on the substrate, and a gate insulating layer formed on the substrate to cover the gate electrode may be used, and the alignment layer may be formed on the gate insulating layer of this electrode laminated body. When the organic semiconductor element of the invention has this structure, this element can be rendered an organic semiconductor element of a bottom-gate/bottom-contact type. As has been illustrated in FIG. 3, in the organic semiconductor element 10 of the invention, the alignment layer 1 may be formed on the gate insulating layer 13 of the electrode laminated body 14, which has the substrate 11, the gate electrode 12 formed on the substrate, and the gate insulating layer 13, which is formed on the substrate 11 to cover the gate electrode 12.

Figure 4:
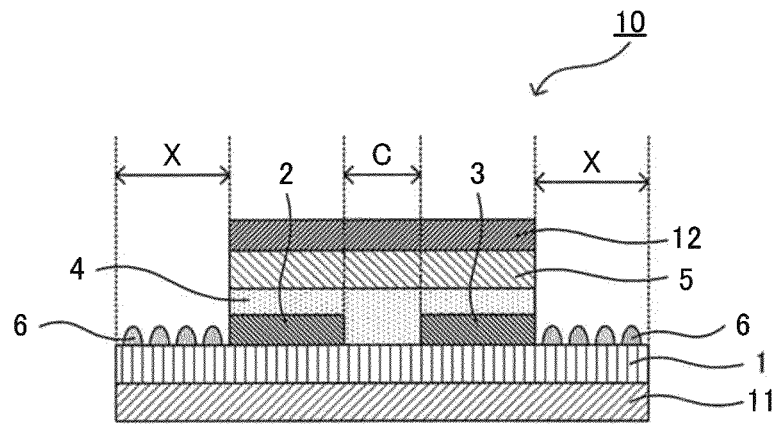
FIG. 4 is a schematic sectional view illustrating a different example of the organic semiconductor element of the invention.

Meantime, it is allowable in the invention to form the above-mentioned alignment layer on a substrate, and form a gate electrode on a dielectric layer. When the organic semiconductor element of the invention has this structure, this element can be rendered an organic semiconductor element of a top-gate/bottom-contact type. As illustrated in FIG. 4, in an organic semiconductor element 10 of the invention, it is allowable to form an alignment layer 1 on a substrate 11 and form a gate electrode 12 on a dielectric layer 5. FIG. 4 is a schematic sectional view illustrating this example, which is a different example of the organic semiconductor element of the invention. Reference signs not referred to herein represent the same members as in FIG. 3, respectively; thus, any description thereabout is omitted herein.

In the invention, the organic semiconductor element may have, as the different constituent, a passivation layer having a function of preventing a deterioration of this element with time. The use of the passivation layer makes it possible to render the organic semiconductor element of the invention an element excellent in durability. The constituent material, the thickness and others of the passivation layer are the same as described in the item "A. Method for manufacturing an organic semiconductor element"; thus, any description thereabout is omitted herein.

Figure 5:
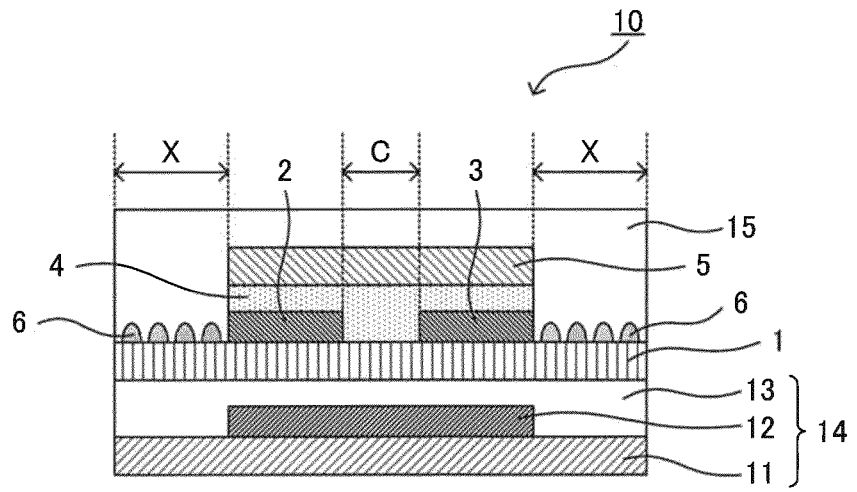
FIG. 5 is a schematic sectional view illustrating a different example of the organic semiconductor element of the invention.
Figure 6:
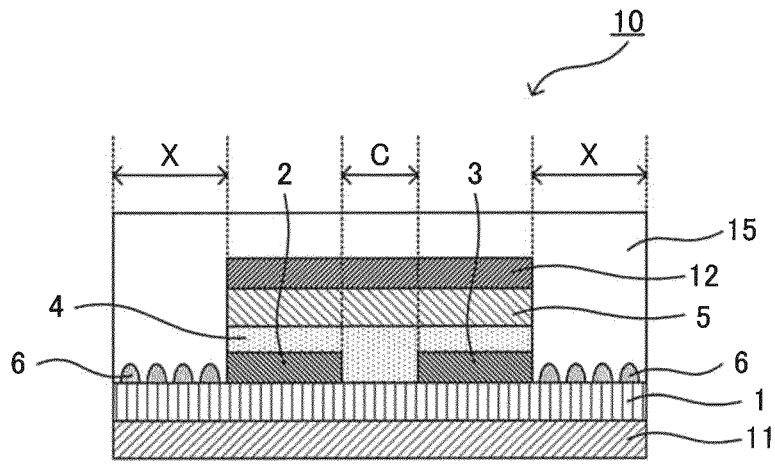
FIG. 6 is a schematic sectional view illustrating a different example of the organic semiconductor element of the invention.

When the organic semiconductor element of the invention is an element that is of a bottom-gate/bottom-contact type and has a passivation layer, it is allowable that as illustrated in FIG. 5, in an organic semiconductor element 10 of the invention, a passivation layer 15 is formed on an alignment layer 1 to cover a dielectric layer 5 and grains of an aggregate 6. Meantime, when the organic semiconductor element of the invention is an element that is of a top-gate/bottom-contact type and has a passivation layer, it is allowable that as illustrated in FIG. 6, in an organic semiconductor element 10 of the invention, a passivation layer 15 is formed on an alignment layer 1 to cover a gate electrode 12 and grains of an aggregate 6. It is allowable that as illustrated in FIG. 7, in an organic semiconductor element 10 of the invention, a passivation layer 15 is formed on an alignment layer 1 to cover a dielectric layer 5 and grains of an aggregate 6 and further agate electrode 12 is formed on the passivation layer 15.

Figure 7:
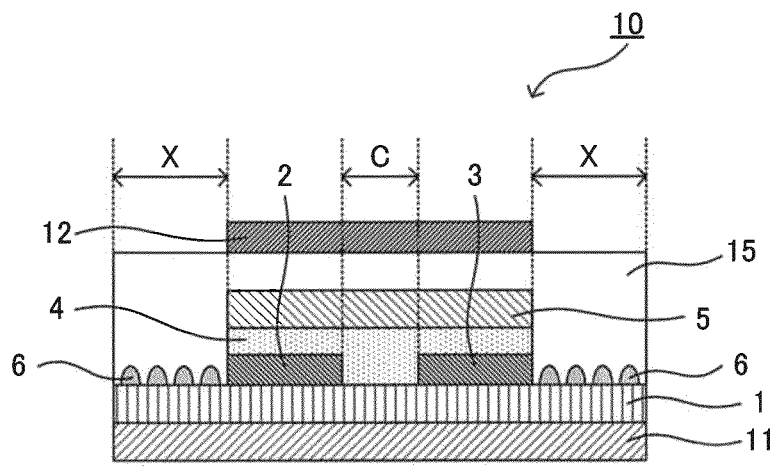
FIG. 7 is a schematic sectional view illustrating a different example of the organic semiconductor element of the invention.

FIGS. 5 to 7 are each a schematic sectional view of one of the examples referred to herein, which is a different example of the organic semiconductor element of the invention. Reference signs not referred to herein represent the same members as in FIG. 3, respectively; thus, any description thereabout is omitted herein.

The organic semiconductor element of the invention may be manufactured by, for example, the method described in the item "A. Method for manufacturing an organic semiconductor element".

The invention is not limited to the above-mentioned embodiments. The embodiments are illustrative examples. Any embodiment that has substantially the same structure and produces the same effects and advantages as any embodiment having the technical conception recited in the claims of the invention is included in the technical scope of the invention.

EXAMPLES

Hereinafter, the invention will be specifically described by way of working examples.

Example 1

Liquid Crystal Phase Identifying, and Phase Transition Temperature Checking Experiments In order to identify/check a liquid crystal phase of 5,5''-dioctyl-2,2':5',2''-terthiophene (hereinafter referred to as "8-TTP-8"), which is a liquid crystal organic semiconductor material, and the phase transition temperature of this compound, the texture thereof was observed through a polarizing microscope (BH2-UMA™, manufactured by Olympus Corp.) using a heating stage (FP82HT™, FP80HT™, manufactured by Mettler-Toledo International Inc.), and further this compound was measured with a DSC (differential scanning calorimeter, DSC204 μ-Sensor™, manufactured by Netzsch Co.). The following results were then obtained: Iso: 92.0; SmC: 88.1; SmF: 73.6; SmG: 65.3 cryst. (° C.).
(Formation of an Electrode Laminated Body)
<Substrate, Gate Electrode and Gate Insulating Layer>

A used substrate was an n-heavily-doped silicon wafer, 0.6 mm in thickness, on which a silicon oxide layer of about 3000 angstroms (300 nm) thickness was deposited. This was a wafer in which its n-heavily-doped silicon region functioned as a gate electrode while the silicon oxide layer functioned as a gate insulating layer. The electrostatic capacity thereof was about 11 $nF/cm^2$ (nanofarads/square centimeter).
(Alignment Layer Formation Step)

The electrode laminated body was immersed in a 0.1-M solution of n-octyltrichlorosilane (OTS) in dehydrated toluene at 60° C. for 20 minutes. Next, this wafer was washed with toluene, acetone, and isopropyl alcohol. A nitrogen gun was used to remove the remaining liquid, and then the resultant was dried at 100° C. for 1 hour to form an alignment layer (thickness: 1 to 2 nm) for aligning a liquid crystal organic semiconductor material vertically to the front surface thereof.
(Source Electrode and Drain Electrode Formation Step)

By vacuum deposition, Cr was deposited into a thickness of 3 nm and Au was deposited into a thickness of 27 nm through a shadow mask onto the alignment layer to have a width (W) of 1000 μm and a length (L) of 50 nm. In this way, a source electrode and a drain electrode were formed.
(Organic Semiconductor Layer Formation Step)

A chloroform solution containing 4% by weight of the 8-TTP-8, which is a liquid crystal organic semiconductor material, was coated onto the alignment layer by spin coating (at 2000 rpm for 10 seconds) to cover the source electrode and the drain electrode. In this way, an organic semiconductor layer of about 100 nm thickness was formed.
(Dielectric Layer Formation Step)

A dielectric-layer-forming coating liquid was prepared in which Teflon AF™ (manufactured by Du Pont-Mitsui Fluorochemicals Co., Ltd.) was dissolved in FC40™ (manufactured by Sumitomo 3M Ltd.) into a concentration of 6% by weight. The coating liquid was coated onto the organic semiconductor element by screen printing to be positioned at least on a channel region between the source electrode and the drain electrode. The resultant workpiece was dried at 60° C. for 30 minutes to form a dielectric layer of 550 nm thickness.
(Annealing Step)

In the atmosphere, at 90° C. for 1 minute, the laminated body was annealed, which was composed of the electrode laminated body, the alignment layer, the source electrode and the drain electrode, the organic semiconductor layer and the dielectric layer. In this way, organic semiconductor elements were each manufactured.

Comparative Example 1

Organic semiconductor elements were each manufactured in the same way as in Example 1 except that the above-mentioned annealing was not conducted.

Example 2

Organic semiconductor elements were each manufactured in the same way as in Example 1 except that a passivation layer formation step described below was performed between the dielectric layer formation step and the annealing step.
(Passivation Layer Formation Step)

A laminate film (manufactured by Meikoshokai Co., Ltd.) of 100 μm thickness was thermally pressed and bonded onto the organic semiconductor layer at 90° C. to cover the dielectric layer. In this way, a passivation layer was formed.

Comparative Example 2

Organic semiconductor elements were each manufactured in the same way as in Example 2 except that the annealing step was not conducted.
[Evaluation]
(Observation of the Organic Semiconductor Elements)

Figure 8:
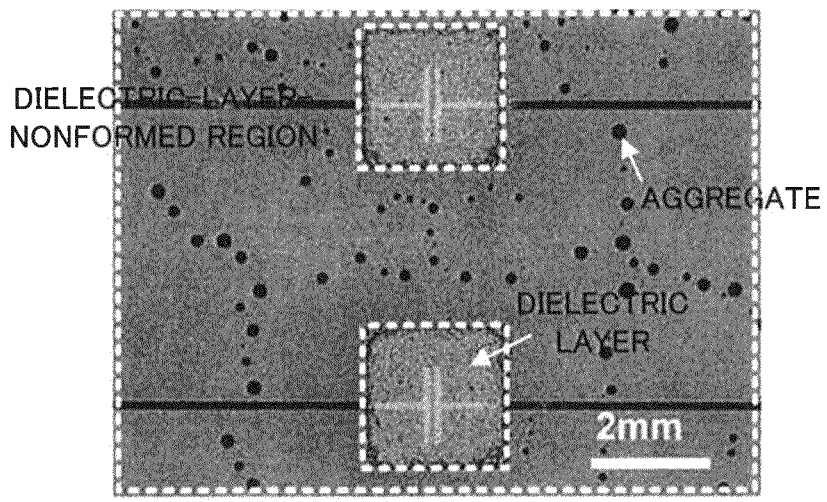
FIG. 8 is a graph showing an observation result of any one out of organic semiconductor elements manufactured in Example 1.

A polarizing microscope was used to observe the organic semiconductor elements manufactured in the above-mentioned working examples and comparative examples from above these elements (from the dielectric layer side thereof). In FIG. 8 is shown a result of the observation of any one of the organic semiconductor elements yielded in Example 1. As shown in FIG. 8, it was verified that in Example 1, an aggregate of the liquid crystal organic semiconductor material was formed in the dielectric-layer-nonformed region. In Example 2 also, it was verified in the same way that an aggregate of the liquid crystal organic semiconductor material was formed in the dielectric-layer-nonformed region, this situation being not illustrated. By contrast, in Comparative Examples 1 and 2, no aggregate of the liquid crystal organic semiconductor material was verified.
(Transistor Property Evaluation)

About the organic semiconductor elements manufactured in the working examples and the comparative examples, transistor properties thereof were evaluated. The evaluation of the transistor properties was made, using a device, 237 HIGH VOLTAGE SOURCE MEASUREMENT UNIT™, manufactured by Keithley Instruments Inc. The carrier mobility (μ) (of each of the elements) was calculated in accordance with an equation described below, using data in their saturated region (gate voltage $V_g$<source/drain voltage $V_{sd}$). In the equation, $I_d$ represents the drain current in the saturated region; W and L, the width and the length of the semiconductor channel, respectively; Ci, the electrostatic capacity per unit area of the gate electrode; and $V_g$ and $V_{th}$, the gate voltage and the threshold voltage, respectively. The $V_{th}$ of this device was calculated from a relationship between the square root of the $I_d$ in the saturated region and the $V_g$ of the device that was gained by extrapolating $I_d$=0 from measured data.

$$I_d = Ci\mu(W/2L)(V_g - V_{th})^2$$

Results of the evaluation are shown in Table 1 described below. Results of the transistor property evaluation of the organic semiconductor elements manufactured in Example 1, Comparative Example 1, Example 2 and Comparative Example 2 are shown in FIGS. 9 to 12, respectively. Each of the mobilities shown in Table 1 described below is the average value of the mobilities of the respective organic semiconductor layers that were obtained from 5 or more of the transistors (of each of these examples). About conditions for the measurement, the gate voltage $V_g$ was applied in the range of +20 to −40 V and the source/drain voltage $V_{sd}$ was applied to give −40 V in the atmosphere. In each of FIGS. 9 to 12, FEM represents the (average) mobility of the organic semiconductor layers.

TABLE 1

| | $V_{sd}$ (V) | $V_{th}$ (V) | MOBILITY (cm²/Vs) | ON CURRENT (A) | OFF CURRENT (A) |
|---|---|---|---|---|---|
| EXAMPLE 1 | −40 | −4.10 | 0.0146 | $1.6 \times 10^{-6}$ | $2.5 \times 10^{-12}$ |
| COMPARATIVE EXAMPLE 1 | −40 | −1.71 | 0.0106 | $1.5 \times 10^{-6}$ | $1.0 \times 10^{-9}$ |
| EXAMPLE 2 | −40 | −3.66 | 0.0174 | $2.4 \times 10^{-6}$ | $3.0 \times 10^{-12}$ |
| COMPARATIVE EXAMPLE 2 | −40 | −5.80 | 0.0178 | $2.1 \times 10^{-6}$ | $1.5 \times 10^{-9}$ |

Figure 9:
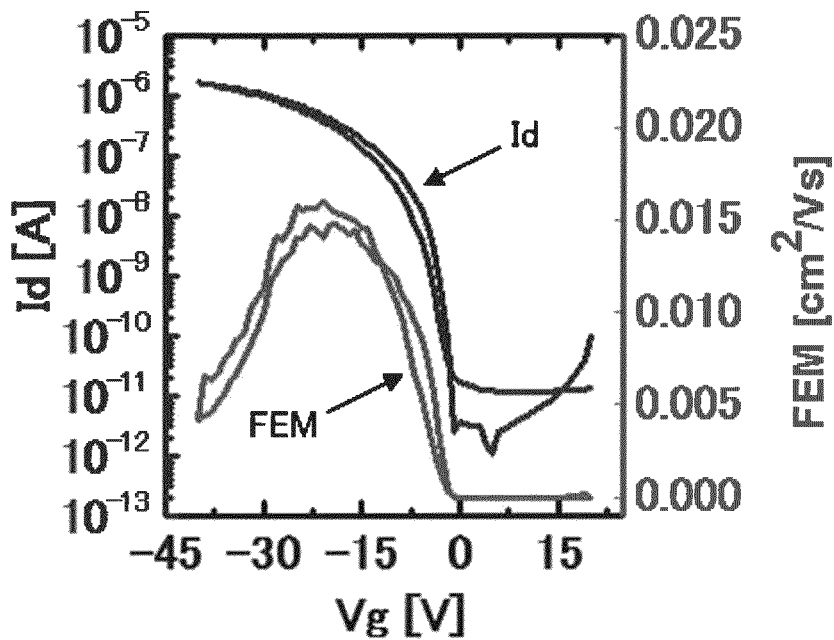
FIG. 9 is a graph showing evaluation results of transistor properties of the organic semiconductor elements manufactured in Example 1.
Figure 10:
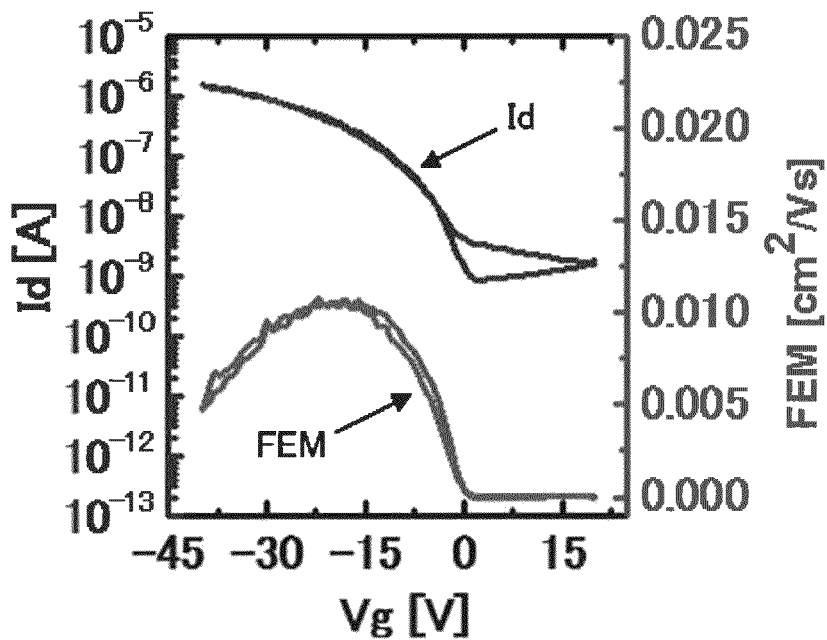
FIG. 10 is a graph showing evaluation results of transistor properties of organic semiconductor elements manufactured in Comparative Example 1.

When FIGS. 9 and 10 are compared with each other, it is verified that in Example 1, the OFF current value thereof was made lower than in Comparative Example 1. As shown in Table 1, it is verified that in Example 1, the mobility of the organic semiconductor layers was made better than that in Comparative Example 1.

Figure 11:
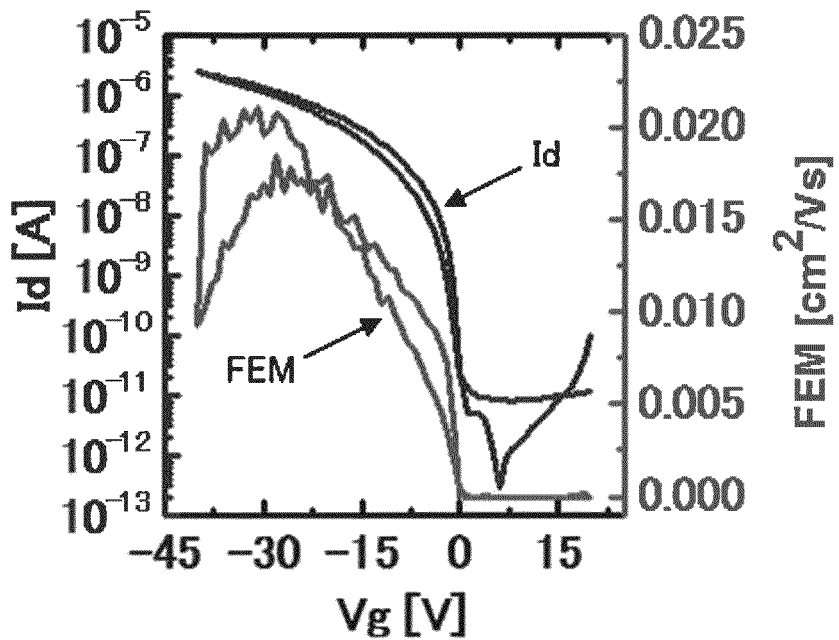
FIG. 11 is a graph showing evaluation results of transistor properties of organic semiconductor elements manufactured in Example 2.
Figure 12:
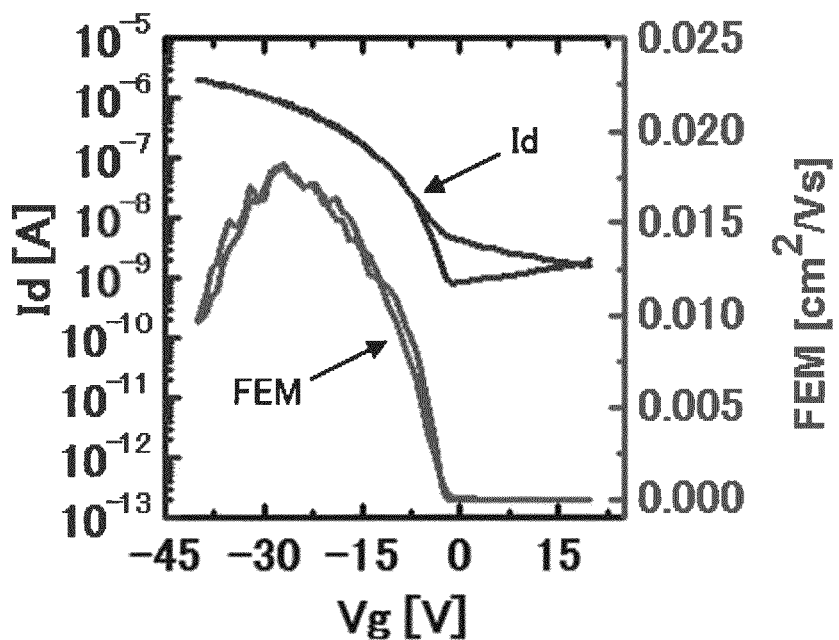
FIG. 12 is a graph showing evaluation results of transistor properties of organic semiconductor elements manufactured in Comparative Example 2.

When FIGS. 11 and 12 are compared with each other, similarly, it is verified that in Example 2, the OFF current value thereof was made lower than in Comparative Example 2. As shown in Table 1, it is verified that in Example 2, the mobility of the organic semiconductor layers was substantially equivalent to that in Comparative Example 2.

From the above-mentioned results, it can be considered that in the method of the invention for manufacturing an organic semiconductor element, its organic semiconductor layer can easily be patterned without being lowered in mobility through the annealing step.

REFERENCE SIGNS LIST

1 . . . alignment layer
2 . . . source electrode
3 . . . drain electrode
4 . . . organic semiconductor layer
5 . . . dielectric layer
6 . . . aggregate
10 . . . organic semiconductor element
11 . . . substrate
12 . . . gate electrode
13 . . . gate insulating layer
14 . . . electrode laminated body
15 . . . passivation layer
C . . . channel region
X . . . dielectric-layer-nonformed region

The invention claimed is:

1. A method for manufacturing an organic semiconductor element, comprising steps of:
forming a source electrode and a drain electrode
on an alignment layer
for aligning a liquid crystal organic semiconductor material;
forming an organic semiconductor layer
comprising the liquid crystal organic semiconductor material to cover the source electrode and the drain electrode;
forming a dielectric layer
on the organic semiconductor layer
to be positioned at least on a channel region between the source electrode and the drain electrode; and
annealing the organic semiconductor layer
at a liquid crystal phase temperature of the liquid crystal organic semiconductor material
to form an aggregate of the liquid crystal organic semiconductor material on the alignment layer in a region where the dielectric layer is not located.

2. The method for manufacturing an organic semiconductor element according to claim 1, comprising, before the source electrode and drain electrode formation step, an alignment layer formation step of using an electrode laminated body having a substrate, a gate electrode formed on the substrate and a gate insulating layer on the substrate to cover the gate electrode, and forming the alignment layer on the gate insulating layer of the electrode laminated body.

3. The method for manufacturing an organic semiconductor element according to claim 1, wherein the alignment layer is a layer capable of aligning the liquid crystal organic semiconductor material vertically.

4. An organic semiconductor element, comprising:
an alignment layer for aligning a liquid crystal organic semiconductor material;
a source electrode and a drain electrode formed on the alignment layer;
an organic semiconductor layer
comprising the liquid crystal organic semiconductor material and formed on the alignment layer
to cover the source electrode and the drain electrode; and
a dielectric layer
formed on the organic semiconductor layer
at least on a channel region between the source electrode and the drain electrode;
wherein an aggregate of the liquid crystal organic semiconductor material is formed on the alignment layer in a region where the dielectric layer is not located.

5. The organic semiconductor element according to claim 4, comprising an electrode laminated body having a substrate, a gate electrode formed on the substrate, and a gate insulating layer formed on the substrate to cover the gate electrode, wherein the alignment layer is formed on the gate insulating layer of the electrode laminated body.

* * * * *